United States Patent [19]

Sondergeld

[11] 4,409,115
[45] Oct. 11, 1983

[54] ETCHING SOLUTION FOR ETCHING OF PHOTOPOLYMERIC FILMS

[75] Inventor: Manfred A. J. Sondergeld, Mulheim, Fed. Rep. of Germany

[73] Assignee: E. I. Du Pont de Nemours & Co., Wilmington, Del.

[21] Appl. No.: 420,480

[22] Filed: Sep. 20, 1982

[30] Foreign Application Priority Data

Dec. 21, 1981 [DE] Fed. Rep. of Germany ....... 3150637

[51] Int. Cl.$^3$ .............................................. C09K 13/02
[52] U.S. Cl. .................................. 252/79.1; 156/655; 156/668; 156/905; 252/79.5; 430/306; 430/310

[58] Field of Search ..................... 252/79.1, 79.5, 156; 156/654, 655, 659.1, 668, 905; 430/269, 306, 310

[56] References Cited

U.S. PATENT DOCUMENTS 4,173,673  11/1979  Bratt et al. .......................... 428/217

Primary Examiner—William A. Powell

[57] ABSTRACT

Etching solution for dot etching photopolymerized materials which comprises an organic polymeric binder having alkali soluble groups, monomer and photoinitiator, the material having an optical density in the actinic region of at least 1.0, wherein a water-soluble salt of a water-insoluble polymeric polycarboxylic acid whose acid strength is the same or less than that of the binder is present as the etching agent.

4 Claims, No Drawings

ETCHING SOLUTION FOR ETCHING OF PHOTOPOLYMERIC FILMS

DESCRIPTION

1. Technical Field

This invention relates to solutions for etching photopolymerizable elements. More particularly, this invention relates to etching solutions for dot etching photopolymerized elements having an alkali-soluble polymeric binder.

2. Background Art

Photopolymerizable reproduction materials or elements have found numerous applications in the area of photographic reproduction technology. Thus, they are used primarily for the preparation of printing plates and in the area of photofabrication for the preparation of printed circuits. Recently, photopolymerizable reproduction materials which can be used in graphic arts for the preparation of line and screen contacts have become known. These materials are suitable for replacing litho films based on silver halide used up to now for this purpose. Such reproduction materials are, e.g., described in U.S. Pat. No. 4,173,673. There is special practical significance attached to materials which can be developed in aqueous alkaline solutions. A preferred area of application of these materials is the preparation of screen negatives and positives, as well as screened color separations for reprography, especially for the preparation of printing plates. An important prerequisite for the use of these photopolymerizable reproduction materials is that the screened images obtained be dot etchable, i.e., the size of the obtained dots can be reduced in selected areas in order to be able to make necessary tone value and/or color corrections.

According to U.S. Pat. No. 4,173,673 etching of the polymeric screen dots can take place by treatment with the developer solution, whereby the developing process is carried out until there is an essential under-etching of the exposed areas. Subsequently, then, the polymerized screen dot is reduced in size by mechanical abrasion.

Depending on the polymeric binder present in the photopolymerizable composition, suitable developer solutions are either organic solvents or aqueous alkali solutions. It is disadvantageous that it is not possible to etch in a controlled manner with this so-called solvent etching method, i.e., to obtain a uniform dot reduction on larger areas, because the degree of dot reduction greatly depends on the time of application as well as the amount of etching solution used. Additionally, with longer application times of the developer solutions on the exposed areas of the image there is a strong swelling of the screen dots which frequently leads to considerable losses of density.

Therefore, it is an object of the present invention to provide etching solutions which make it possible to etch in a controlled manner dot etchable photopolymerized materials which contain a polymeric binder with alkali soluble groups and whose optical density in the actinic range is at least 1.0.

DISCLOSURE OF THE INVENTION

In accordance with this invention there is provided an etching solution for dot etching photopolymerized materials which comprise an organic polymeric binder having alkali soluble groups, a polymer of an ethylenically unsaturated monomeric compound, and a photoinitiator or photoinitiator system, the photopolymerized material having an optical density in the actinic region of the spectrum of at least 1.0, the improvement wherein the etching solution contains as the etching agent a water-soluble salt of a water-insoluble polymeric polycarboxylic acid whose acid strength is the same or less than that of the organic polymeric binder present in the photopolymerized material.

According to a preferred embodiment of the invention, the etching solutions can contain an excess of free alkali. It is possible with the help of the described etching solutions to carry out etching in a controlled manner, i.e., to achieve uniform dot reduction on larger areas. The maximum density of the screen image is not influenced by these etching solutions. The superior action of these etching solutions is based on the fact that they lose their etching ability after a certain application time. It is believed that there is an ion exchange between the etching agent and the salt-forming groups of the polymeric binder whereby water-soluble alkali salts of the binder necessary for etching are formed. As a result of this ion exchange, a phase of the water-insoluble free polymeric polycarboxylic acid in the contact range between the polymerized dot and the etching solution is formed, which acts as a diffusion barrier for further alkali from the etching solution into the binder, so that the etching process comes to a stop.

Suitable polymeric polycarboxylic acids for the preparation of the etching solutions are, e.g., vinyl addition polymers which contain free carboxylic acid groups and are prepared from 30 to 94 mol-% of one or several alkyl acrylates and 70 to 6 mol-% of one or several $\alpha,\beta$-ethylenically unsaturated carboxylic acids, preferably of 61 to 94 mol-% of two alkyl acrylates and 39 to 6 mol-% of an $\alpha,\beta$-ethylenically unsaturated carboxylic acid. Suitable alkyl acrylates include: methyl acrylate, ethyl acrylate, propyl acrylate, butyl acrylate, methyl methacrylate, ethyl methacrylate, and butyl methacrylate, etc. Suitable $\alpha,\beta$-ethylenically unsaturated carboxylic acids, by way of example, are acrylic acid and methacrylic acid. Also suitable are copolymers comprising a vinyl monomer of the styrene type and an unsaturated monomer containing carboxyl groups, copolymers of vinyl acetate and crotonic acid, copolymers of ethyl acrylate, methyl methacrylate, and acrylic acid, copolymers of methyl methacrylate and methacrylic acid, copolymers of methyl methacrylate, ethyl acrylate, and hydrogen maleate, copolymers of vinyl chloride, vinyl acetate, and maleic acid, copolymers of styrene and maleic acid anhydride or maleic acid semi-esters as well as copolymers of methyl methacrylate, ethyl acrylate, and methacrylic acid.

To prepare the etching solutions, the polymeric polycarboxylic acid is first dispersed in water followed by the addition of the alkali solution, and these are stirred to complete dissolution. The amount of alkali used is equivalent to or exceeds the acid number of the polycarboxylic acid. A specific etching solution according to the invention can be prepared as follows:

The polymer is dispersed in water and, if desired, up to a 30% excess of alkali solution is added than corresponds to the acid number of the binder.

The acid strength of the polymeric polycarboxylic acid can be measured by titration in alcoholic solution. 500 mg of the polymer are dissolved in 75 ml ethanol and are titrated with 0.1 N aqueous NaOH solution up to the equivalence (end) point, the pH being monitored with a glass electrode during titration. The pH at which half of the carboxyl groups is neutralized can be read off from the plot of the pH against the volume of the standard solution added. This pH corresponds to the $pK_a$-value of the carboxylic acid (Houben-Weyl, 4th Edition 1955, Vol. 3/2, p. 166). For the actual carrying out of the etching process, the etching solution is applied, e.g., with a brush onto the image areas to be etched and after the etching process has come to a stop, it is removed by means of an absorbent paper. Then the etchable part of the screen dots is removed by light rubbing with a sponge and water. The end point of the etching process can be easily recognized when an indicator is added to the etching solution whose end point corresponds to the equivalence (end) point of the polycarboxylic acid used in the etching solution. After the color change the reaction is substantially complete. The etching process can be repeated as often as necessary until the desired degree of etching is achieved. Using the described etching solutions postexposed materials dot reductions up to 9% are achieved, while with materials, which were not subjected to any postexposure, dot reductions up to 25% are possible.

According to a preferred embodiment the etching solution can contain an excess of free alkali. In this case, the etching process takes place in two stages. In the first stage the free alkali is active and the coating is etched as if by a solvent. After consumption of the excess alkali, the controlled etching begins until the ion exchange is finished and the etching process comes to an end. The concentration of the free alkali, of course, must be prechosen to avoid achieving the desired degree of etching by solvent etching alone. The optimal amount of free alkali necessary for achieving the required degree of etching can be easily determined by a series of tests of the etching solutions with different contents of free alkali.

The use of the combination of free alkali/alkali salt of a polymeric polycarboxylic acid makes it possible for those skilled in the art to prepare a series of etching solutions in a simple manner, by which any desired degree of etching can be achieved without the danger of over- or under-etching. Preferred etchable materials within the scope of the invention consist essentially of a support film and a photopolymerizable layer, which has as essential ingredients an aqueous alkaline developable organic polymeric binder, an ethylenically unsaturated monomer and an initiator or initiator system and has an optical density of at least 1.0 in the actinic region of the spectrum. Suitable aqueous alkaline developable binders are widely known. These binders generally contain functional groups soluble in alkali, such as acid anhydride-, carboxyl-, or sulfonic acid groups. Examples are: arylic acid and/or methacrylic acid polymers and/or their copolymers with other suitable monomers, e.g., acrylic acid ester or other acryl derivatives; vinyl compounds, such as vinyl ether, vinyl acetate, or their saponification product, styrene, vinyl pyrrolidone; butadiene, and related monomers; polyacrylic acid anhydrides; copolymers of maleic acid anhydride, maleic acid, maleic acid semiesters, -semiamides and/or anhydrides and derivatives of related compounds, such as itaconic acid, with suitable comonomers, such as styrene, vinyl ethers, vinyl acetates, etc.; polystyrene sulfonic acid and/or their copolymers; cellulose derivatives, such as e.g., cellulose phthalate or succinate, alginic acid and their derivatives. Suitable binders, are furthermore polymeric polycarboxylic acids that can also be used as etching agents. Suitable monomers which are polymerized can be taken from U.S. Pat. No. 4,173,673 which is incorporated by reference. To obtain an optical density of at least 1.0, necessary to form a polymerization gradient which makes possible the under-etching of the polymeric screen image, ultraviolet stable dyes and/or pigments are added to the light sensitive layer. Colloidal carbon is especially preferred as a pigment. Useful ultraviolet absorbers are likewise widely known, e.g., from U.S. Pat. No. 4,173,673. 2,2'-dihydroxy-4-methoxy-benzophenone has proven to be especially useful.

EXAMPLES

The following examples illustrate the invention wherein the parts and percentages are by weight. The molecular weights are number average molecular weights Mn. The Mn for the polymers described herein can be determined by gel permeation chromatography employing a polybutadiene standard or other standard known to those skilled in the art.

EXAMPLE 1

A photopolymerizable material of the following composition was prepared:

| | Ingredient | Amount (%) |
|---|---|---|
| (a) | Terpolymer comprising ethyl acrylate, methyl methacrylate, and acrylic acid (56/37/7), MW ca. 260,000, acid number 76-85, $pK_a$ in ethanol 8.3 | 16.2 |
| (b) | 1:1 Copolymer comprising styrene and maleic acid anhydride partially esterified with sec. butanol, MW ca. 10,000, acid number 190, $pK_a$ in ethanol 8.3 | 30.3 |
| (c) | 2,2'-Bis (2-chlorophenyl)-4,4',5,5'-tetraphenyl-bisimidazole | 5.8 |
| (d) | 4,4'-Bis (dimethylamino) benzophenone | 2.3 |
| (e) | Nonionic surface active fluorohydrocarbon, FC-430 ® manufactured by 3M Co. | 0.1 |
| (f) | Trimethylol propane triacrylate | 27.2 |
| (g) | Mixed esters comprising triethylene glycol dicaproate and diacrylate | 1.7 |
| (h) | Colloidal carbon | 16.4 |

To prepare the coating solution first a 10% solid solution of components (b) to (g) was prepared in methylene chloride. Components (a) and (h) were likewise dispersed in methylene chloride using a high-speed mixer. To this dispersion was then added the solution of components (b) to (g). The coating solution then was applied onto a polyethylene terephthalate support film, which was provided with an intermediate layer according to the data of Example 3 of U.S. Pat. No. 4,173,673 so that the layer thickness after drying was 6 μm. The optical density in the visible range was 3.2 and in the spectral range from 300 to 500 nm it was 4.5. An overcoat of the following composition was applied onto the light-sensitive layer:

| Ingredient | Amount (g) |
|---|---|
| Distilled water | 122.5 |
| Polyvinyl alcohol (saponified 98%, low-molecular weight) | 2.25 |
| Colloidal silica (30% solution) | 2.70 |

| Ingredient | Amount (g) |
|---|---|
| Polyoxyethylene surfactant | 0.45 |

The layer thickness of the dried coating was 2 μm. The material then was exposed for 7 seconds at a distance of 65 cm using a metal halide lamp (1000 W) through a 50% screen used as an original. After exposure the coating layer was removed by washing with water and the material was developed for 5 seconds at 30° C. using a solution of the following composition:

52.5 g $K_2CO_3$
3.1 g $KHCO_3$
water to 1 liter.

The unexposed material was then removed by water spray. An exact negative copy of the screen cover sheet was obtained. The dried material was then postexposed in the conventional manner from the front and the back and then was treated with an etching solution of the following composition:

| | |
|---|---|
| 7.5 g | 1:1 Copolymer comprising styrene and maleic acid anhydride, partially esterified with sec. butanol, MW ca. 10,000, acid number 190, $pK_a$ in ethanol 8.3 |
| 50 ml | Distilled water |
| 16.5 ml | NaOH, 2N |

To carry out the etching, the etching solution was applied to the material with a brush and, at the end of the process the excess etchant was absorbed with an absorbent paper. The etchable portion of the dots was removed by light rubbing with a sponge and water.

The achieved dot reductions of the original 50% dot are summarized in Table 1:

TABLE 1

| Application time of the Etching Solution (Sec) | Dot Size After Etching (%) | Optical Density in the visible range |
|---|---|---|
| 1 × 15 | 45 | 3.2 |
| 2 × 15 | 41 | 3.2 |
| 1 × 30 | 45 | 3.2 |
| 2 × 30 | 41 | 3.2 |

It is evident from Table 1, that the degree of etching attained is independent of the duration of action of the etching solution and that the etching process comes to a stop after a certain duration of action. It is moreover evident, that optical density is not influenced.

EXAMPLE 2

An exposed and developed material prepared according to the procedure of Example 1 was etched according to the procedure of Example 1 with an etching solution of the following composition:

| | |
|---|---|
| 7.5 g | Terpolymer comprising ethyl acrylate, methyl methacrylate, and acrylic acid (56/37/7), MW ca. 260,000, acid number 76–85, $pK_a$ in ethanol 8.3 |
| 50.0 ml | Distilled water |
| 6.7 ml | NaOH, 2N |

Dot reductions obtained are summarized in Table 2:

TABLE 2

| Application time of the Etching Solution (Sec) | Dot Size After Etching (%) | Optical Density in the visible range |
|---|---|---|
| 1 × 15 | 47 | 3.2 |
| 2 × 15 | 44 | 3.2 |
| 1 × 30 | 46 | 3.2 |
| 2 × 30 | 42 | 3.2 |

It is evident from the table, that the etching process is finished after a certain duration of action and an overetching is practically excluded. It is moreover evident, that optical density is not influenced.

EXAMPLE 3

Various screen dot sizes using suitable screen cover sheets were exposed onto a photopolymerizable reproduction material according to Example 1. The material was developed according to the procedure of Example 1 and then was etched with an etching solution of the following composition containing an indicator:

| | |
|---|---|
| 133.0 ml | Distilled water |
| 15.0 g | 1:1 Copolymer comprising styrene and maleic acid anhydride, partially esterified with sec. butanol, MW ca. 10,000, acid number 190, $pK_a$ in ethanol 8.3 |
| 2.78 g | NaOH, solid |
| 100.0 mg | Phenolphthaleine |

A decoloration was observed after application of the etching solution, which came to a stop after ca. 30 seconds and indicated the end of the etching process.

The obtained dot reductions are summarized in Table 3:

TABLE 3

| Original Dot Sizes (%) | Dot Sizes after Etching (%) |
|---|---|
| 5 | 3 |
| 40 | 32 |
| 50 | 40 |
| 60 | 52 |
| 90 | 86 |
| 95 | 93 |
| 98 | 97 |

It is evident from the table, that in etching different dot sizes there is a similar result as in etching silver halide films, i.e., average tones are reduced more strongly than the two ends of the tone scale. It is moreover advantageous, that sharp dots next to high tone values can be etched without the danger that the sharp dots are destroyed.

EXAMPLE 4

An exposed and developed material according to the procedure of Example 1 was etched according to the procedure of Example 1 with etching solutions which contained a varied content of free alkali. The etching solutions used had the following composition:

| | |
|---|---|
| To each 66.5 ml | $H_2O$ distilled and |
| 7.5 g | 1:1 Copolymer comprising styrene and maleic acid anhydride, partially esterified with sec. butanol, MW 10,000, acid number 190, $pK_a$ in |

-continued ethanol 8.3 were added

| | | |
|---|---|---|
| (A) | 1.01 g NaOH, solid | |
| (B) | 1.15 g NaOH, solid | |
| (C) | 1.32 g NaOH, solid. | |

The dot reductions obtained are summarized in Table 4:

TABLE 4

| Application time (sec) | Dot Size After Etching With | | |
|---|---|---|---|
| | Solution (A) (%) | Solution (B) (%) | Solution (C) (%) |
| 1 × 30 | 48 | 47 | 46 |
| 2 × 30 | 48 | 45 | 43 |
| 1 × 60 | 48 | 46 | 45 |
| 2 × 60 | 47 | 43 | 40 |

It is evident from the table that the degree of dot reduction per application cycle can be predetermined by the composition of the etching solution without the danger of overetching the dots.

EXAMPLE 5

An exposed and developed material prepared according to the procedure of Exaple 1 was etched according to the procedure of Example 1 with etching solutions of the following composition:

| | Etching Solution (A) |
|---|---|
| 65.0 ml | H₂O distilled |
| 7.5 g | Copolymer comprising methyl methacrylate, ethyl acrylate, methacrylic acid (48/27/25), 2.4 · 10⁻² mol-COOH, acid number 178, pK$_a$ in ethanol 8.7 |
| 12.0 ml | NaOH, 2N (2.4 · 10⁻² mol) |
| | Etching solution (B) |
| 65.0 ml | H₂O distilled |
| 7.5 g | 1:1 Copolymer comprising styrene and maleic acid anhydride, partially esterified with secondary butanol, 2.54 · 10⁻² mol-COOH, acid number 190, pK₂ in ethanol 8.3 |
| 1.01 g | NaOH, solid (2.54 · 10⁻² mol) |
| | Etching solution (C) |
| 65.0 ml | H₂O distilled |
| 7.5 g | Copolymer comprising methyl methacrylate, acrylic acid, t-octyl acryl amide, hydroxy propyl methacrylate, t-butyl amino-ethyl methacrylate (35/16/40/5/4), 1.34 · 10⁻² mol-COOH, acid number 100, pK$_a$ in ethanol 8.2 |
| 6.7 ml | NaOH, 2N (1.34 · 10⁻² mol) |

The dot reductions obtained with the individual etching solutions are summarized in Table 5:

TABLE 5

| Application Time (sec) | Dot Size After Etching With | | |
|---|---|---|---|
| | Solution (A) (%) | Solution (B) (%) | Solution (C) (%) |
| 30 | 49 | 48 | 50 |
| 60 | 49 | 48 | 50 |

TABLE 5-continued

| Application Time (sec) | Dot Size After Etching With | | |
|---|---|---|---|
| | Solution (A) (%) | Solution (B) (%) | Solution (C) (%) |
| 90 | 49 | 48 | 50 |

It is evident from the table, that the alkali salts of polymeric polycarboxylic acids, whose acid strength is the same or less than that of the binder, cause controlled etching, while the alkali salts of polymeric polycarboxylic acids whose acid strength is greater than that of the binder are not effective, i.e., there is no etching action.

EXAMPLE 6

A material according to the procedure of Example 1 was used with the sole difference that the material was not postexposed. This material then was etched according to the procedure of Example 1 with the following etching solutions:

A: Etching solution (A) of Example 5, to which was added 1 ml 2 N NaOH, so that the excess of free alkali was 8.3%

B: Etching solution (C) of Example 5, to which was added 0.55 ml 2 N NaOH, so that the excess of free alkali was 8.3%.

The dot reductions obtained with the two etching solutions are summarized in Table 6:

TABLE 6

| Application Time (sec) | Dot Size After Etching With | |
|---|---|---|
| | Solution A (%) | Solution C (%) |
| 30 | 11 | 2 |
| 60 | 12 | 5 |
| 90 | 14 | 10 |

It is evident from the table, that the etching process using Solution A comes to a stop after a short time, i.e., the etching is controlled, while with Solution C there is a pure solvent etching, i.e., the degree of etching depends very much on the application time of the etching solution.

I claim:

1. An etching solution for dot etching photopolymerized materials which comprise an organic polymeric binder having alkali soluble groups, a polymer of an ethylenically unsaturated monomeric compound, and a photoinitiator or photoinitiator system, the photopolymerized material having an optical density in the actinic region of the spectrum of at least 1.0, the improvement wherein the etching solution contains as the etching agent a water-soluble salt of a water-insoluble polymeric polycarboxylic acid whose acid strength is the same or less than that of the organic polymeric binder present in the photopolymerized material.

2. Etching solution according to claim 1 wherein the etching solution additionally contains up to a 30% excess by weight of free alkali than corresponds to the acid of the organic polymeric binder.

3. Etching solution according to claim 1 or claim 2 wherein the etching solution contains as the etching agent an alkali salt of the organic polymeric binder present in the photopolymerized material.

4. Etching solution according to claim 3 wherein the etching solution contains as the etching agent an alkali salt of a 1:1 copolymer comprising styrene and maleic acid anhydride, which is partially esterified with secondary butanol.

* * * * *